United States Patent
Yoon et al.

(10) Patent No.: US 12,281,008 B2
(45) Date of Patent: Apr. 22, 2025

(54) SUSPENDED TYPE NANOWIRE AND MANUFACTURING METHOD THEREOF

(71) Applicant: Korea Advanced Institute of Science And Technology, Daejeon (KR)

(72) Inventors: Jun-Bo Yoon, Daejeon (KR); Jaeshin Lee, Daejeon (KR); Kwang-Wook Choi, Daejeon (KR); Min-Seung Jo, Daejeon (KR)

(73) Assignee: Korea Advanced Institute of Science and Technology, Daejeon (KR)

( * ) Notice: Subject to any disclaimer, the term of this patent is extended or adjusted under 35 U.S.C. 154(b) by 1310 days.

(21) Appl. No.: 16/929,955

(22) Filed: Jul. 15, 2020

(65) Prior Publication Data

US 2021/0017020 A1 Jan. 21, 2021

(30) Foreign Application Priority Data

Jul. 16, 2019 (KR) ........................ 10-2019-0085649

(51) Int. Cl.
*B82B 1/00* (2006.01)
*B82B 3/00* (2006.01)

(52) U.S. Cl.
CPC .............. *B82B 1/005* (2013.01); *B82B 3/008* (2013.01)

(58) Field of Classification Search
CPC ....... B82B 1/005; B82B 3/008; B82B 3/0014; B82B 3/0061; B81B 3/007; B81B 2203/0109; B81B 2203/019; B82Y 15/00; B82Y 40/00; C23C 14/0005; C23C 14/225
See application file for complete search history.

(56) References Cited

U.S. PATENT DOCUMENTS

| | | | | |
|---|---|---|---|---|
| 9,645,135 B2 * | 5/2017 | Shin | ................... | G01N 27/4146 |
| 2012/0036919 A1 * | 2/2012 | Kamins | ................ | G01N 27/127 |
| | | | | 438/49 |
| 2016/0079508 A1 * | 3/2016 | Kim | ...................... | H10N 10/17 |
| | | | | 438/54 |

FOREIGN PATENT DOCUMENTS

| | | | |
|---|---|---|---|
| JP | 2009537978 A | * | 10/2009 |
| KR | 20100091650 A | | 8/2010 |
| KR | 20110129800 A | | 12/2011 |
| KR | 20170000211 A | | 1/2017 |

OTHER PUBLICATIONS

Park, Joong-Mok; "Fabrication of metallic nanowires and nanoribbons using laser interference lithography and shadow lithography"; IOPscience Publishing Ltd (Year: 2010).*

(Continued)

*Primary Examiner* — Jennifer A Steele
(74) *Attorney, Agent, or Firm* — FOLEY & LARDNER LLP (57) ABSTRACT

Provided is a suspended type nanowire that is fixed and electrically connected to each of a first electrode disposed on a substrate and a second electrode disposed on the substrate and spaced apart from the first electrode and suspended on the substrate. Here, a cross-section in a direction perpendicular to a longitudinal direction of the suspended type nanowire includes at least one curved part, and the curve part includes a reference surface and at least one side surface extending downward from the reference surface.

9 Claims, 6 Drawing Sheets

(56) References Cited

OTHER PUBLICATIONS

J.M. Park et al., "Fabrication of metallic nanowires and nanoribbons using laser interference lithography and shadow lithography," Nanotechnology, 2010, 215301, pp. 1-6.
Office Action mailed Sep. 10, 2020 in counterpart Korean Appl. 10-2019-0085649 (5 pgs.).
Kihyun Kim et al., "Suspended honeycomb nanowire ISFETs for improved stiction-free performance," Nanotechnology, 2014,25:345501, pp. 1-7.

* cited by examiner

SECTION A-A

FIG. 4

SECTION A-A

SUSPENDED TYPE NANOWIRE AND MANUFACTURING METHOD THEREOF

CROSS-REFERENCE TO RELATED APPLICATIONS

This U.S. non-provisional patent application claims priority under 35 U.S.C. § 119 of Korean Patent Application No. 10-2019-0085649, filed on Jul. 16, 2019, the entire contents of which are hereby incorporated by reference.

BACKGROUND

The present disclosure herein relates to a suspended type nanowire and a manufacturing method thereof.

Researches on a nanowire having excellent electrical and mechanical properties have been performed in various fields as nanotechnology is developed.

The nanowire has a limitation in alignment in a specific direction and arrangement at an exact position because the nanowire has an extremely small physical size.

Particularly, in case of a nanowire applied to a thermoelectric energy harvesting device, a nanowire heater, a nanowire-based transistor, a chemical sensor (for sensing specific molecules such as toxic gases), and a piezoelectric energy harvesting device, the nanowire may not exhibit excellent material properties due to a limitation such as heat dissipation to a substrate, a stress between the substrate and the nanowire, and blockage of a surface of the nanowire.

Thus, a nanowire capable of being stably suspended on a substrate is required to exhibit the excellent material properties thereof.

However, although typical technologies disclose various manufacturing methods of the nanowire, a manufacturing method for nanowire structural stability has yet to be disclosed.

Figure 1A:
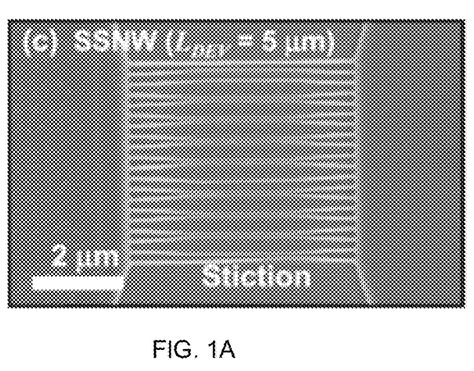
FIG. 1A is a photograph showing that stiction between a substrate and a nanowire is generated in a manufacturing process of the suspended type nanowire (non-patent document 1)
Figure 1B:
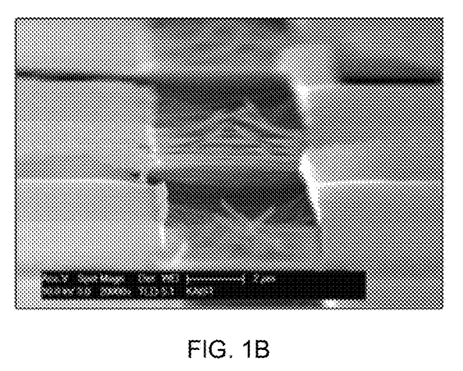
FIG. 1B is a photograph showing that the nanowire, which completes a suspension process, is broken due to a stress.

Thus, a nanowire having improved structural stability that is strong against bending and stably suspended although a spaced distance between nanowires is extremely small in order to resolve a limitation such as stiction (refer to FIG. 1A) between adjacent nanowires, which is further deteriorated as the nanowire has a great length, and being broken (refer to FIG. 1B) due to a residual stress or a mass load is required to be developed.

RELATED ART

Patent Document (Patent document 1) Korean Publication Patent No. 10-2010-0091650 (publication date: Aug. 19, 2010)
(Patent document 2) Korean Publication Patent No. 10-2011-0129800 (publication date: Dec. 2, 2011)

Non-Patent Document (Non-patent document 1) Dissertation, Nanotechnology 2014 25, 345501.

SUMMARY

The present disclosure provides a nanowire having improved structural stability that is strong against bending and stably suspended regardless of a length thereof in order to resolve a limitation such as stiction between adjacent nanowires, being bent or broken due to a residual stress, and being broken by a mass load of an electrode, and a manufacturing method thereof.

An embodiment of the present invention provides a suspended type nanowire that is fixed and electrically connected to each of a first electrode disposed on a substrate and a second electrode disposed on the substrate and spaced apart from the first electrode and suspended on the substrate, and a cross-section in a direction perpendicular to a longitudinal direction of the suspended type nanowire includes at least one curved part.

In an embodiment, the curved part may include: a reference surface; and at least one side surface extending downward or upward.

In an embodiment, the side surface may have one end contacting one end of the reference surface and the other end extending downward from the reference surface.

In an embodiment, the cross-section may have a ㄱ-shape or ㄴ-shape including: a first area extending outward based on the reference surface; and a second area extending outward based on the reference surface.

In an embodiment, a maximum height of the first area may be equal to or different from that of the second area.

In an embodiment, the side surface may include: a first side surface having one end contacting one end of the reference surface and the other end extending downward from the reference surface; and a second side surface having one end contacting the other end of the reference surface and the other end extending downward from the reference surface.

In an embodiment, the cross-section may have a ㄷ-shape including: a first area extending outward based on the reference surface; a second area extending outward based on the first side surface; and a third area extending outward based on the second side surface.

In an embodiment, a maximum height of the second area may be equal to or different from that of the third area, and a maximum height of the first area may be equal to or greater than a greater value of the maximum height of the second area and the maximum height of the third area.

In an embodiment, each of the first electrode and the second electrode may be one of a thermoelectric device, a piezoelectric device, a nanowire heater, a transistor, a chemical sensor, and an infrared light emitter.

In an embodiment of the present invention, a manufacturing method of a suspended type nanowire that is fixed and electrically connected to each of a first electrode disposed on a substrate and a second electrode disposed on the substrate and spaced apart from the first electrode and suspended on the substrate includes: a substrate providing process of providing the substrate including at least one protruding part; a deposition process of depositing a deposition material by spraying the deposition material at a predetermined inclined angle in an incident direction of at least one of one side or the other side of the protruding part; and a separation process of separating, from the substrate, the suspended type nanowire having a cross-section including at least one curved part by the deposition process.

In an embodiment, the side surface may have one end contacting one end of the top surface and the other end extending downward from the top surface.

In an embodiment, the deposition process may spray the deposition material at a predetermined inclined angle in the incident direction of the one side of the protruding part to grow the deposition material at one side surface and a top surface of the protruding part.

In an embodiment, a maximum height of the deposition material grown at the top surface of the protruding part may be equal to or greater than that of the deposition material grown at the one side surface of the protruding part.

In an embodiment, in a manufacturing method of a suspended type nanowire according to another embodiment, the side surface may include: a first side surface having one end contacting one end of the top surface and the other end extending downward from the top surface; and a second side surface having one end contacting the other end of the top surface and the other end extending downward from the top surface.

In an embodiment, the deposition process may include: a first deposition process of depositing the deposition material by spraying the deposition material at a predetermined inclined angle in the incident direction of the one side of the protruding part; and a second deposition process of depositing the deposition material by spraying the deposition material at a predetermined inclined angle in the incident direction of the other side of the protruding part. Here, the inclined angle of the first deposition process may be equal to or different from that of the second deposition process.

In an embodiment, a maximum height of the deposition material grown at the one side surface of the protruding part may be equal to or different from that of the deposition material grown at the other side surface of the protruding part, and a maximum height of the deposition material grown at the top surface of the protruding part may be equal to or greater than a greater value of the maximum height of the deposition material grown at the one side surface of the protruding part and the maximum height of the deposition material grown at the other side surface of the protruding part.

DETAILED DESCRIPTION

The present invention will now be described more fully with reference to the accompanying drawings, in which exemplary embodiments of the invention are shown. These embodiments are provided so that this disclosure will be thorough and complete, and will fully convey the concept of the invention to those skilled in the art. The invention may, however, be embodied in many different forms and should not be construed as being limited to the embodiments set forth herein. Therefore, it will be understood that the embodiments disclosed in this specification includes some variations without limitations to the shapes as illustrated in the figures without departing form the spirit or scope of the invention. Also, the position or the arrangement of each component in the embodiment may be varied without departing form the spirit or scope of the invention. Thus, it is intended that the present invention covers the modifications and variations of this invention provided they come within the scope of the appended claims and their equivalents. Further, the present invention is only defined by scopes of claims. In the drawings, like reference numerals refer to like elements throughout.

First, a suspended type nanowire according to an embodiment of the present invention will be described.

Figure 2:
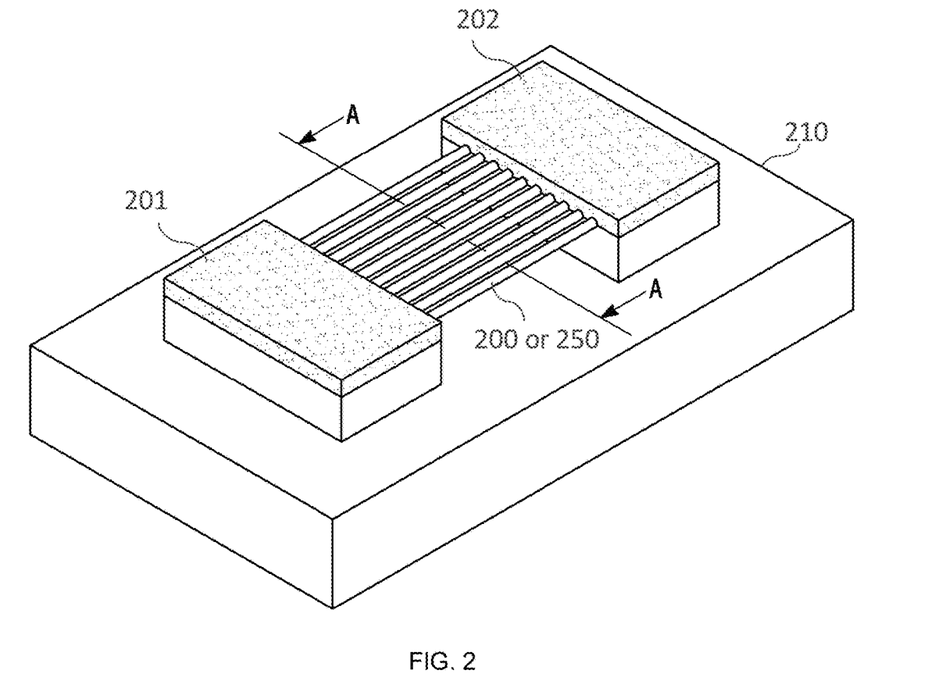
FIG. 2 is a perspective view illustrating an installation example of a suspended type nanowire according to an embodiment of the present invention.
Figure 3:
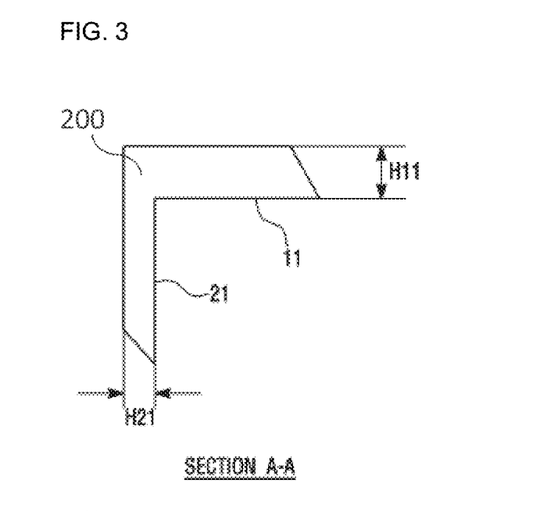
FIG. 3 is a cross-sectional view taken along line A-A of FIG. 2 and illustrating an embodiment 1.
Figure 4:
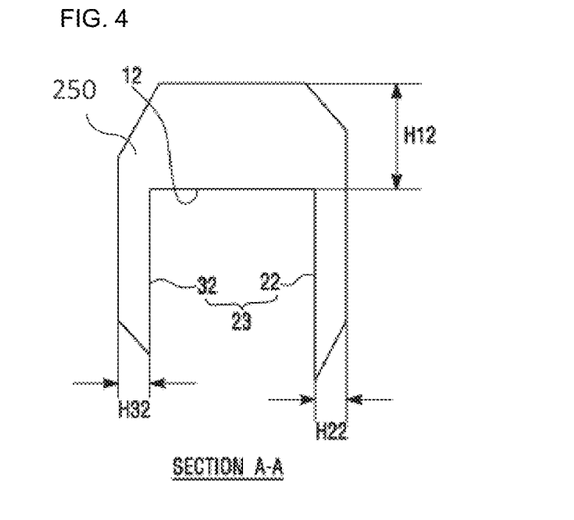
FIG. 4 is a cross-sectional view taken along line A-A of FIG. 2 and illustrating an embodiment 2.

FIG. 2 is a perspective view illustrating an installation example of the suspended type nanowire according to an embodiment of the present invention, FIG. 3 is a cross-sectional view taken along line A-A and illustrating a first embodiment, and FIG. 4 is a cross-sectional view taken along line A-A and illustrating a second embodiment.

As illustrated in FIG. 2, the present invention relates to the suspended type nanowire 200 or 250 that is electrically connected to each of a first electrode 201 disposed on a substrate 210 and a second electrode 202 disposed on the substrate 210 and spaced apart from the first electrode 201 and is suspended on the substrate 210.

Here, each of the first electrode and the second electrode may be one of a thermoelectric device, a piezoelectric device, a nanowire heater, a transistor, a chemical sensor, and an infrared light emitter. FIG. 8 is an image showing examples of the suspended type nanowire being applied, and (a) is an image of being applied to a harmful gas sensing device, (b) is an image of being applied to a light emitting device, (c) is an image of being applied to an IR sensing device, and (d) is an image of being applied to a thermoelectric device.

As illustrated in FIGS. 3 and 4, the suspended type nanowire 200 according to the present invention may include at least one curved part on a cross-section in a direction perpendicular to a longitudinal direction thereof, and the curved part may include a reference surface 11 and at least one side surface 21 extending downward from the reference surface 11.

Here, the reference surface 11 of a substrate 210 of a curved part (see FIG. 5A) may be parallel to a top surface of the nanowire 200.

As illustrated in FIG. 3, a first embodiment (hereinafter, referred to as an embodiment 1) of the suspended type nanowire 200 according to the present invention may be formed such that one end of the side surface 21 contacts one end of the reference surface 11, and the other end of the side surface 21 extends downward from the reference surface 11.

The embodiment 1 may have a cross-section having a ⌐-shape including a first area extending outward based on the reference surface 11 and a second area extending outward based on the side surface 21.

Although the other end extends downward from the reference surface 11 in the embodiment 1, this is merely an embodiment. The embodiment of the present invention is not limited to the extension direction of the other end of the suspended type nanowire. That is, the other end may extend upward or downward from the reference surface 11, and the cross-section may have a ∟-shape or a ⌐-shape according to a manufacturing method of the suspended type nanowire.

In the embodiment 1, the first area may have a maximum height H11 equal to or different from a maximum height H21 of the second area. Preferably, the maximum height H11 of the first area may be equal to or greater than the maximum height H21 of the second area.

Since a portion receiving a greatest stress by the gravity in a suspended state is a side of the reference surface 11, i.e., the first area, the height and area of the first area may be expanded to increase the moment of inertia of the first area, thereby increasing mechanical properties (an elastic limit, an yield point, a tensile strength, a flexural or breaking strength, an elongation rate, a cross-section contraction rate, a fatigue limit, etc.) of the suspended type nanowire.

As illustrated in FIG. 4, a second embodiment (hereinafter, referred to as an embodiment 2) of the suspended type nanowire 250 according to the present invention may include a side surface 23 including a first side surface 22 having one end contacting one end of a reference surface 12 and the other end extending downward from the reference surface 12 and a second side surface 32 having one end contacting the other end of the reference surface 12 and the other end extending downward from the reference surface 12.

The suspended type nanowire 250 of the embodiment 2 may have a cross-section having a ⊏-shape including a first area extending outward based on the reference surface 12, a second area extending outward based on the first side surface 22, and a third area extending outward based on the second side surface 32.

Although each of the first side surface 22 and the second side surface 32 extends downward from the reference surface 12 in the embodiment 2, this is merely an embodiment. The embodiment of the present invention is not limited to the extension direction of the side surface 23 of the suspended type nanowire. That is, the side surface 23 may extend upward or downward from the reference surface 12, and the cross-section may have a ⊏-shape (an intersection symbol) having a through-portion heading downward or a ⊏-shape (an union symbol) having a through-portion heading upward according to the method for manufacturing the suspended type nanowire.

In the embodiment 2, a maximum height H22 of the second area is equal to or different from a maximum height H32 of the third area, and a maximum height H12 of the first area is equal to or different from the maximum height H22 of the second area or the maximum height H32 of the third area. Preferably, the maximum height H12 of the first area may be equal to or greater than a greater value of the maximum heights H22 and H32 of the second area and the third area. This has the same reason as that of the embodiment 1. Thus, description thereof will be omitted.

Although the side surface 21 and 23 is perpendicular to the reference surface 11 and 12 in FIGS. 3 and 4, this is merely an embodiment. The embodiment of the present invention is not limited to the angle between the reference surface 11 and 12 and the side surface 21 and 23.

Also, although the suspended type nanowire has a linear cross-section, the embodiment of the present invention is not limited thereto. For example, a substantial deposition material may have an uneven surface or a specific portion that is remarkably high or low.

Hereinafter, a manufacturing method of the suspended type nanowire according to an embodiment of the present invention will be described.

The manufacturing method of the suspended type nanowire according to an embodiment of the present invention includes: a first embodiment (hereinafter, referred to an embodiment 1) that is a method for manufacturing the embodiment 1 of the suspended type nanowire in FIG. 3; and a second embodiment (hereinafter, referred to an embodiment 2) that is a method for manufacturing the embodiment 2 of the suspended type nanowire in FIG. 4.

Figure 9:
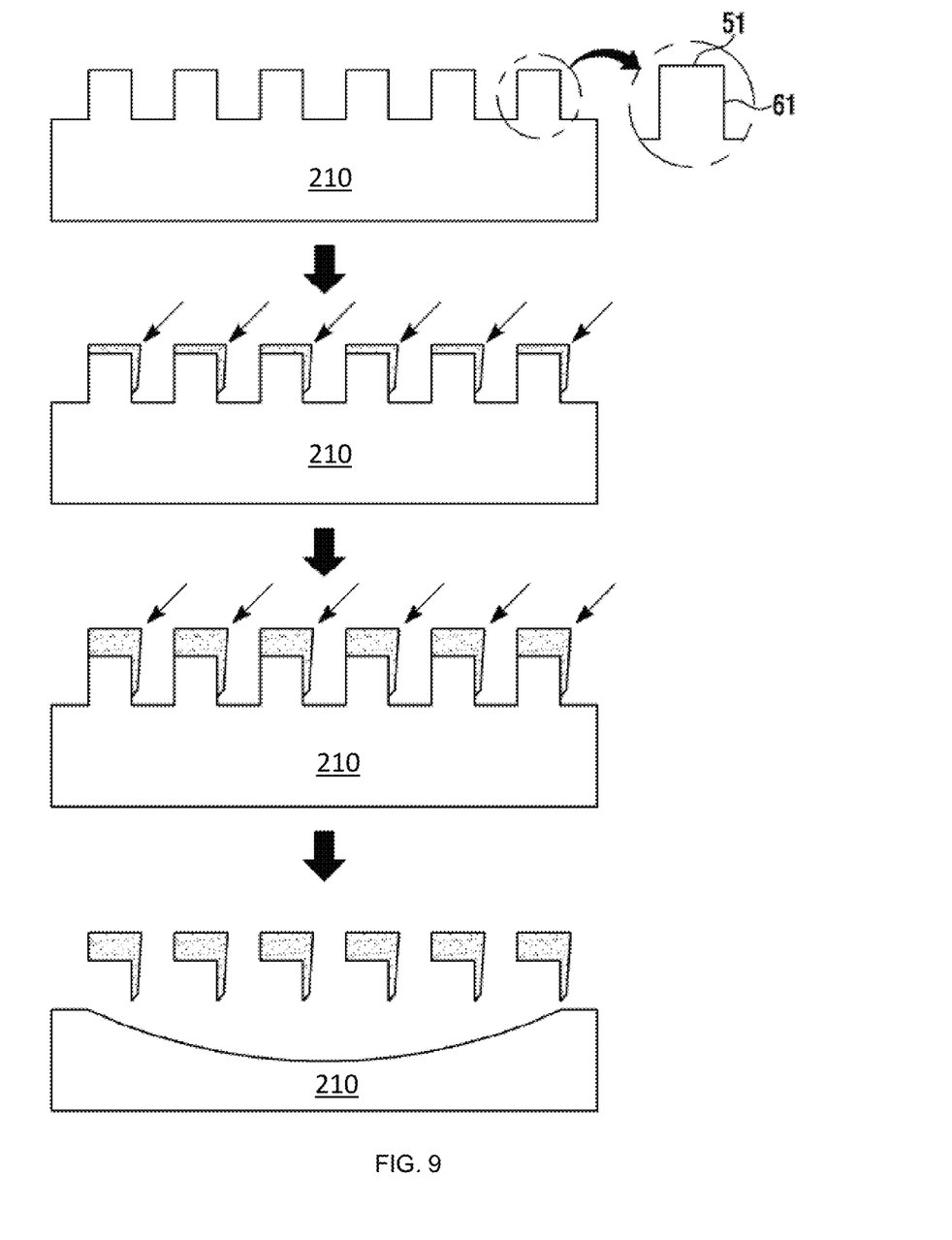
FIG. 9 is a flowchart representing a method for manufacturing a suspended type nanowire according to the embodiment 1 of the present invention.
Figure 10:
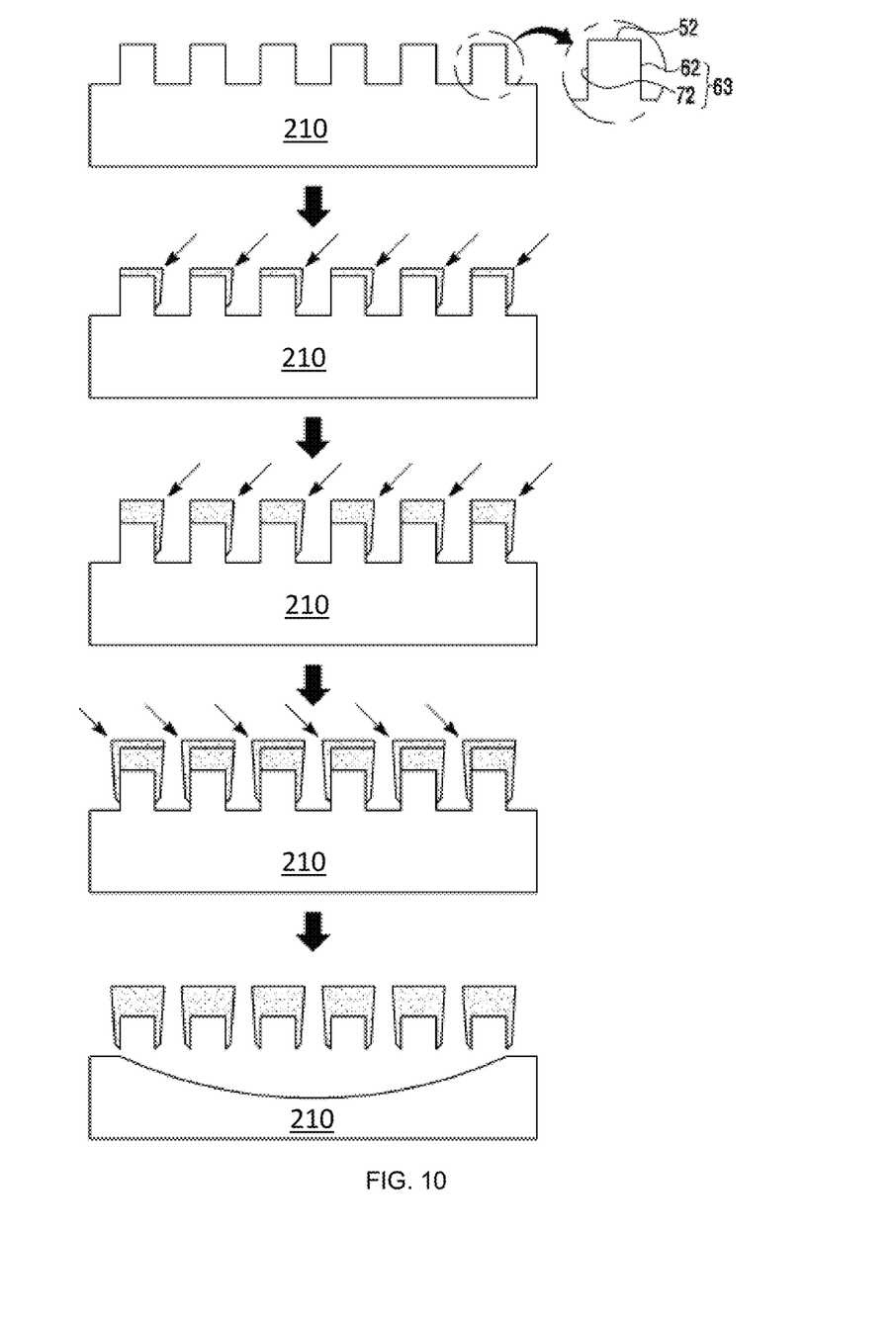
FIG. 10 is a flowchart representing a method for manufacturing a suspended type nanowire according to the embodiment 2 of the present invention.

FIG. 9 is a flowchart representing the embodiment 1 of the present invention, and FIG. 10 is a flowchart representing the embodiment 2 of the present invention.

The present invention relates to the method for manufacturing the suspended type nanowire that is electrically connected to each of the first electrode disposed on the substrate and the second electrode disposed on the substrate and spaced apart from the first electrode, and suspended on the substrate. As illustrated in FIGS. 9 and 10, a substrate providing process of providing the substrate 210, a deposition process of depositing a deposition material by spraying the deposition material, and a separation process of separating the deposition material, which completes deposition with a predetermined thickness, i.e., the nanowire, from the substrate 210 and suspended on a surface of the substrate may be sequentially performed.

Although not shown in FIGS. 9 and 10, a process of forming the protruding part by etching the substrate 210 by a predetermined thickness in a direction from a top surface to a bottom surface of the substrate may be further provided before the substrate providing process.

The substrate providing process may provide the substrate 210 including a top surface 51 and 52 and at least one protruding part including at least one side surface 61 and 63 extending downward from the top surface 51 and 52.

Here, although the manufacturing substrate 210 may be a Si or $SiO_2$ nano-grating substrate, the embodiment of the present invention is not limited to the material of the substrate 210.

Here, although the manufacturing substrate may be a Si or $SiO_2$ nano-grating substrate, the embodiment of the present invention is not limited to the material of the substrate.

The side surface 61 of the protruding part of the embodiment 1 may have one end contacting one end of the top surface 51 of the protruding part and the other end extending downward from the top surface 51 of the protruding part.

The side surface 63 of the protruding part of the embodiment 2 may include a first side surface 62 having one end contacting one end of the top surface 52 of the protruding part and the other end extending downward from the top surface 52 of the protruding part and a second side surface 72 having one end contacting the other end of the top surface 52 of the protruding part and the other end extending downward from the top surface 52 of the protruding part.

Although the side surface 21 and 23 of the suspended type nanowire extends downward by spraying the deposition material to the protruding part in FIGS. 9 and 10, this is merely an embodiment. The embodiment of the present invention is not limited to the spray position of the deposition material. That is, the side surface 21 and 23 of the suspended type nanowire may extend upward or downward according to the spray position of the deposition material.

Although the side surface 61 and 63 of the protruding part is formed at a right angle in FIGS. 9 and 10, this is merely an embodiment. The embodiment of the present invention is not limited to the angle of the side surface 61 and 63 of the protruding part with respect to the top surface 51 and 52 of the protruding part. However, the angle of the side surface 61 and 63 of the protruding part with respect to the top surface 51 and 52 of the protruding part may be in a range from a right angle to an obtuse angle in order to easily separate the nanowire from the substrate in the separation process of the embodiment 2.

The deposition process deposit the deposition material by spraying the deposition at a predetermined inclined angle in the incident direction of at least one of the one side or the other side of the protruding part. The embodiment 1 may spray one time in one direction as illustrated in FIG. 9, and the embodiment 2 may spray two times in different direction as illustrated in FIG. 10.

The deposition material in the deposition process, i.e., a material of the nanowire, may be $SnO_2$ or Pd.

However, this is merely an embodiment. For example, the material of the nanowire may include all kinds of materials that are formed by a physical vapor deposition (PVD) method.

The PVD method is a deposition method of converting energy applied to a target material into a kinetic energy so that the material is movable to be stacked on a substrate. The PVD method may be largely classified into a thermal evaporation deposition, sputtering deposition, and electron beam deposition.

Although the deposition process of the present invention may be performed through the thermal evaporation deposition, the deposition process may be also performed by the sputtering deposition or the electron beam deposition.

For reference, the thermal evaporation deposition is a method of forming a thin-film on a substrate having a relatively low temperature by applying high temperature heat to a material source in a vacuum state.

The electron beam deposition is a method of forming a thin-film on a substrate when electron collision is concentrated to the deposition material by inducing an electron beam emitted when a current is supplied to a filament is induced to a magnetic field caused by a magnet, and the deposition material is evaporated by heating caused by the electron collision.

The sputtering deposition is a method of forming a thin-film by depositing atoms, which are separated by colliding ionized particles to a material source in a vacuum state, on a substrate by using a sputtering phenomenon in which atoms are separated from a surface in case that collision energy is greater than bonding energy of a material surface when ionized atoms are accelerated and collided to a material.

The deposition process of the embodiment 1 may spray the deposition material at a predetermined inclined angle in the incident direction of one end of the top surface 51 of the protruding part, i.e., the one side of the protruding part, to grow the deposition material at the top surface 51 and the side surface 61 of the protruding part.

The deposition process of the embodiment 2 may include: a first deposition process of spraying the deposition material at a predetermined inclined angle in the incident direction of one end of the top surface 52 of the protruding part, i.e., the one side of the protruding part, to grow the deposition material at the top surface 52 and the side surface 62 of the protruding part; and a second deposition process of spraying the deposition material at a predetermined inclined angle in the incident direction of the other end of the top surface 52 of the protruding part, i.e., the other side of the protruding part, to grow the deposition material at the top surface 52 and the side surface 72 of the protruding part. Here, the inclined angle of the first deposition process may be equal to or different from that of the second deposition process.

Although the flowcharts of FIGS. 9 and 10 illustrate an embodiment of spraying one time in one direction and an embodiment of spraying two times in two directions, respectively, this is merely an embodiment. However, directions of spraying the deposition material may not be equal to the number of spraying in the deposition process of the present invention.

Also, the spraying may be performed in the same direction at different spray angles or in different directions at the same angle.

The deposition process may be variously changed according to a process condition (a deposition method and the kind of the deposition material), a shape of the protruding part (a length of the protruding part, a width of the top surface 51 and 52, and an angle of the side surface 61 and 63), and the kind of the deposition material.

The separation process may separate the suspended type nanowire, which is formed in the deposition process to have a cross-section including at least one curved part, from the substrate and suspend the suspended type nanowire on the surface of the substrate.

The separation process may separate the suspended type nanowire from the substrate by using one of xenon difluoride ($XeF_2$), $CF_4$ plasma, and reactive ion etch (RIE) when the substrate is a Si nano-grating substrate or using vapor HF when the substrate is a $SiO_2$ nano-grating substrate.

In addition, when another material (a sacrificial layer) is present between the substrate and the suspended type nanowire, although the sacrificial layer may be selectively etched, the embodiment of the present invention may be limited to the dry etching method to prevent the suspended type nanowire from being damaged in a processing process.

Hereinafter, the moment of inertia and stability and thermal/optical phenomenon when suspended according to the cross-sectional shape of the nanowire will be described by using drawings and graphs.

Figure 5A:
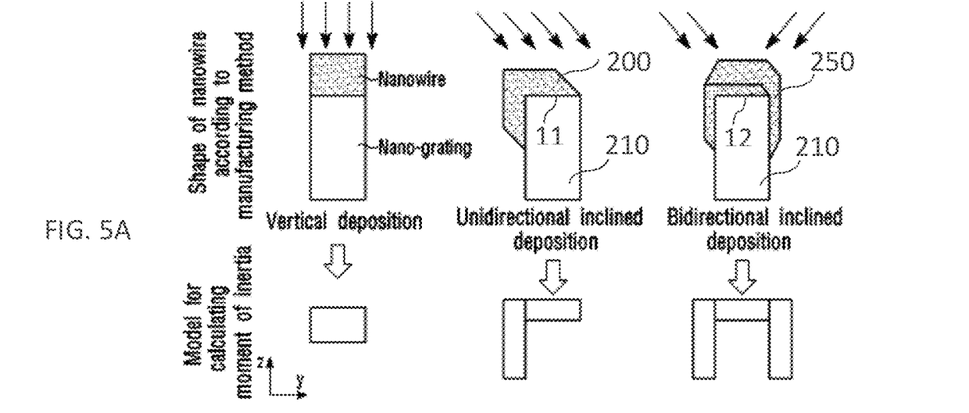
FIG. 5A illustrates cases of deforming a cross-section of the nanowire by adjusting a process condition (a spray direction and a spray angle of a deposition material) while maintaining the same thickness of the deposition material.
Figure 5B:
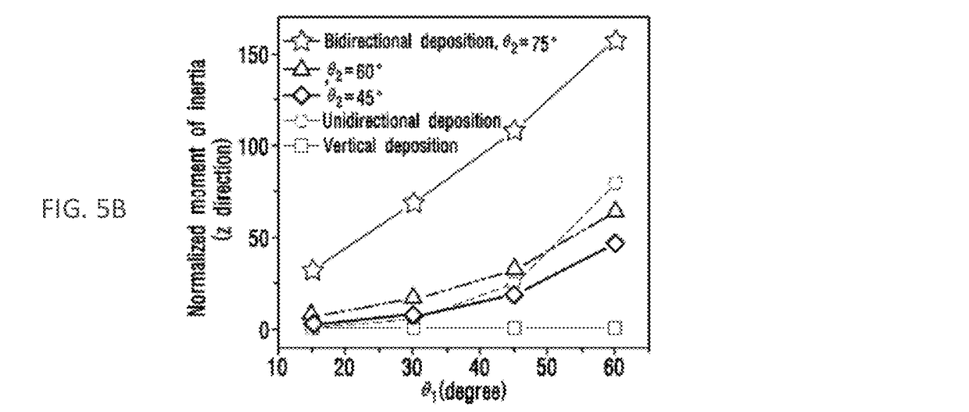
FIG. 5B is a graph representing the moment of inertia in a Z-direction according to the process condition.

FIG. 5A illustrates cases (a typical case, the embodiment 1, and the embodiment 2 in an order from the left) when the cross-section of the nanowire is deformed by adjusting a process condition (a spray direction and a spray angle of the deposition material) while maintaining the same thickness of the deposition material. FIG. 5B is a graph representing the moment of inertia in a Z-direction according to the process condition, and FIG. 5C is a graph representing the moment of inertia in a Y-direction according to the process condition.

Referring to FIG. 5A, it will be understood that the nanowires having completely different cross-sections with the same thickness may be manufactured by adjusting the spray direction and the spray angle of the deposition material.

Figure 5C:
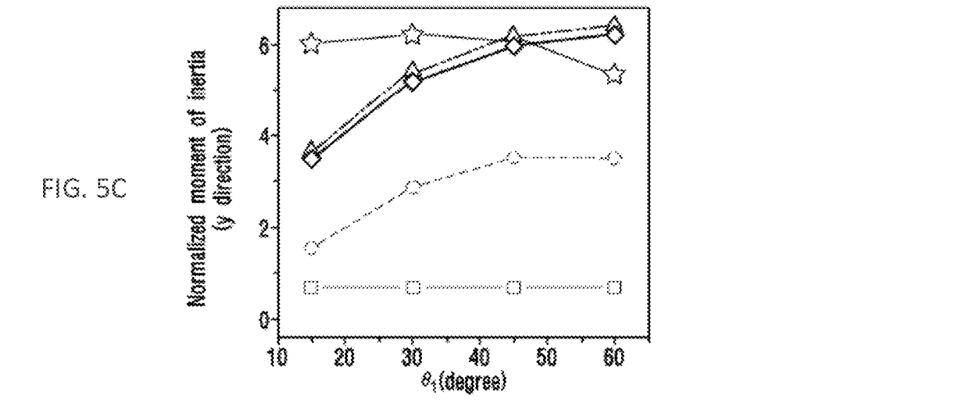
FIG. 5C is a graph representing the moment of inertia in a Y-direction according to the process condition.

Referring to FIGS. 5B and 5C, it will be understood that the nanowire has the totally different moment of inertia according to the cross-sectional shape, unidirectional deposition of the embodiment 1 has the moment of inertia greater than that of a typical vertical deposition, and bidirectional deposition of the embodiment 2 has the moment of inertia much greater than that of the unidirectional deposition of the embodiment 1.

Thus, the present invention may provide the suspended type nanowire having extremely increasing moment of inertia, i.e., strong against bending, by deforming the cross-section of the nanowire through adjusting the spray direction and the spray angle of the deposition material.

Figure 6A:
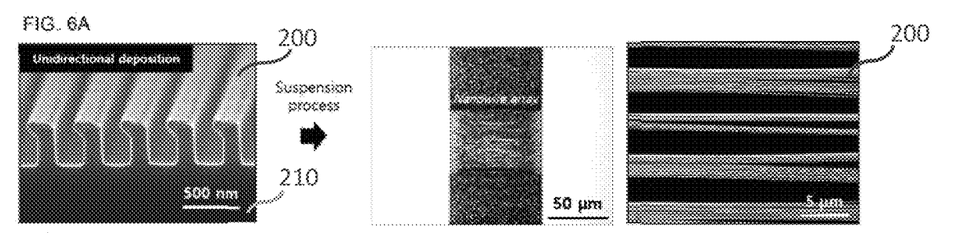
FIG. 6A shows an alignment state of the embodiment 1.
Figure 6B:
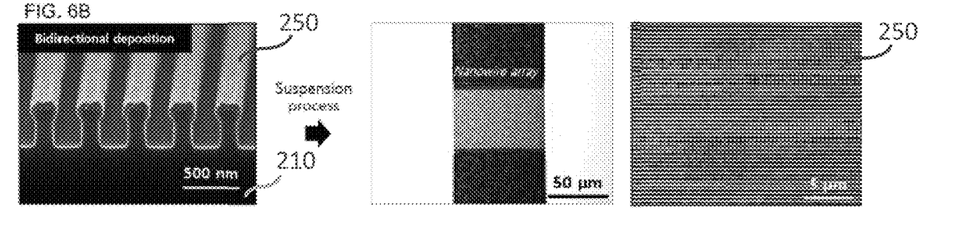
FIG. 6B shows an alignment state of the embodiment 2.
Figure 7A:
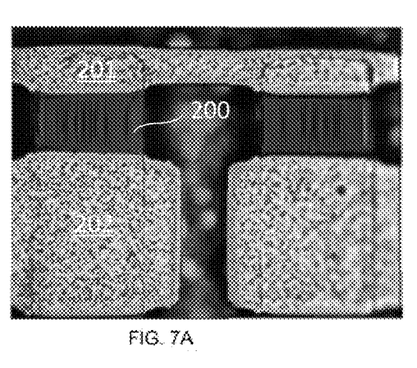
FIG. 7A shows an alignment state of the embodiment 1.

FIG. 6 is a photograph showing an alignment state of the suspended type nanowire made of $SnO_2$. FIG. 6A shows an alignment state 602 of the suspended type nanowire 200 of the embodiment 1, and FIG. 6B shows an alignment state of the suspended type nanowire 250 of the embodiment 2. FIG. 7 is a photograph showing an alignment state of the suspended type nanowire 200 or 250 made of Pd. FIG. 7A shows an alignment state of the suspended type nanowire 200 of the embodiment 1, and FIG. 7B shows an alignment state of the suspended type nanowire 250 of the embodiment 2.

Referring to FIG. 6, it will be understood that the embodiment 1 shows an un-uniform alignment state because stiction is generated between the nanowire and the substrate, and the embodiment 2 shows a stable alignment state because the stiction is not generated between the nanowire and the substrate.

Figure 7B:
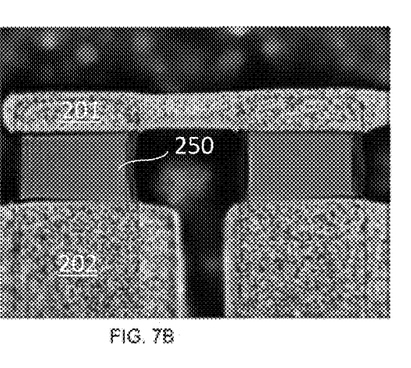
FIG. 7B shows an alignment state of the embodiment 2.
Figure 8A:
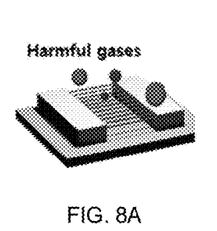
FIG. 8 is an image showing application examples of the suspended type nanowire being applied, and (a) is an image of being applied to a harmful gas sensing device, (b) is an image of being applied to a light emitting device, (c) is an image of being applied to an IR sensing device, and (d) is an image of being applied to a thermoelectric device.
Figure 8B:
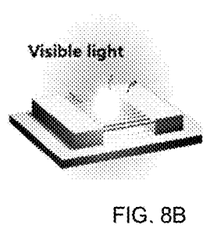
Figure 8C:
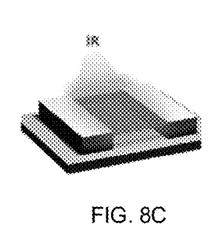
Figure 8D:
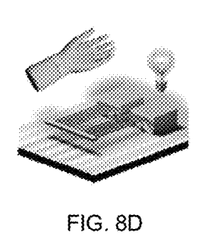

Referring to FIG. 7, it will be understood that the embodiment 1 shows an un-uniform alignment state because the stiction is generated between the nanowire and the substrate, and the embodiment 2 shows a stable alignment state because the stiction is not generated between the nanowire and the substrate.

That is, it will be understood through FIG. 5 that the nanowire manufactured by the inclined deposition according to the present invention has the extremely increasing moment of inertia than that of the nanowire manufactured by the typical vertical deposition, and particularly, the nanowire of the embodiment 2 manufactured by the bidirectional deposition has the moment of inertia much greater than that of the nanowire of the embodiment 1 manufactured by the unidirectional deposition. Also, it will be understood through FIGS. 6 and 7 that since the stiction between the substrate and the nanowire is not generated in the embodiment 2, the embodiment 2 may maintain the alignment state more stable than that of the embodiment 1.

The nanowire and the manufacturing method thereof according to the embodiment of the present invention may use excellent material properties of the nanowire regardless of the substrate to develop excellent devices used in various application fields.

Also, since the nanowire has high mechanical stability, the nanowire may not be bent or broken due to the residual stress or the mass load of the electrode although the nanowire has the great length.

Also, the nanowire may be stably suspended because the stiction between the nanowire and the substrate is not generated.

Also, the nanowire having uniform and high reproducibility at the large area may be manufactured by using the manufacturing process based on the top-down semiconductor process.

Also, the nanowire may be made of various materials by using the PVD method when the nanowire is formed, and the kind of the substrate may be freely made of a material that is selectively etched with the nanowire.

Features, structures, and effects described in the above embodiments are incorporated into at least one embodiment of the present disclosure, but are not limited to only one embodiment. Moreover, features, structures, and effects exemplified in one embodiment can easily be combined and modified for another embodiment by those skilled in the art. Therefore, these combinations and modifications should be construed as falling within the scope of the present disclosure. Moreover, features, structures, and effects exemplified in one embodiment can easily be combined and modified for another embodiment by those skilled in the art. Therefore, these combinations and modifications should be construed as falling within the scope of the present invention.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A suspended type nanowire that is fixed and electrically connected to each of a first electrode disposed on a substrate and a second electrode that is disposed on the substrate and spaced apart from the first electrode, the suspended type nanowire being suspended on the substrate,
   wherein a cross-section in a direction perpendicular to a longitudinal direction of the suspended type nanowire comprises:
   a reference surface; and
   at least one side surface extending to be perpendicular to the reference surface, the at least one side surface having one end contacting one end of the reference surface.

2. The suspended type nanowire of claim 1, wherein the at least one side surface extends downward or upward.

3. The suspended type nanowire of claim 1, wherein the at least one side surface has the other end extending downward from the reference surface.

4. The suspended type nanowire of claim 1, wherein the cross-section comprises:
   a first area extending outward based on the reference surface; and
   a second area extending outward based on the reference surface.

5. The suspended type nanowire of claim 4, wherein a maximum height of the first area is equal to or different from that of the second area.

6. The suspended type nanowire of claim 1, wherein the at least one side surface comprises:
   a first side surface having one end contacting one end of the reference surface and the other end extending downward from the reference surface; and
   a second side surface having one end contacting the other end of the reference surface and the other end extending downward from the reference surface.

7. The suspended type nanowire of claim 6, wherein the cross-section comprises:
   a first area extending outward based on the reference surface;
   a second area extending outward based on the first side surface; and
   a third area extending outward based on the second side surface.

8. The suspended type nanowire of claim 7, wherein a maximum height of the second area is equal to or different from that of the third area, and a maximum height of the first area is equal to or greater than a greater value of the maximum height of the second area and the maximum height of the third area.

9. The suspended type nanowire of claim 1, wherein each of the first electrode and the second electrode is one of a thermoelectric device, a piezoelectric device, a nanowire heater, a transistor, a chemical sensor, and an infrared light emitter.

* * * * *